(12) United States Patent
Wang

(10) Patent No.: US 6,693,934 B2
(45) Date of Patent: Feb. 17, 2004

(54) WAVELENGTH DIVISION MULTIPLEXED VERTICAL CAVITY SURFACE EMITTING LASER ARRAY

(75) Inventor: Tzu-Yu Wang, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/028,438

(22) Filed: Dec. 28, 2001

(65) Prior Publication Data

US 2003/0123507 A1 Jul. 3, 2003

(51) Int. Cl.[7] ................................................. H01S 3/14
(52) U.S. Cl. ............................................. 372/43; 372/40
(58) Field of Search ............................... 372/50, 46, 23, 372/96, 92, 45, 40

(56) References Cited

U.S. PATENT DOCUMENTS

| | | | |
|---|---|---|---|
| 5,388,120 A | * | 2/1995 | Ackley et al. ................. 372/99 |
| 5,699,375 A | * | 12/1997 | Paoli ............................ 372/50 |
| 6,195,485 B1 | | 2/2001 | Coldren et al. |
| 6,362,069 B1 | * | 3/2002 | Forrest et al. ............. 438/401 |
| 2002/0080836 A1 | * | 6/2002 | Hwang ........................ 372/45 |
| 2002/0106160 A1 | * | 8/2002 | Cox et al. ..................... 385/49 |
| 2003/0021317 A1 | * | 1/2003 | Liao et al. ..................... 372/46 |
| 2003/0034508 A1 | * | 2/2003 | Pandya ........................ 257/288 |

OTHER PUBLICATIONS

S.Y. Hu, et al., "Multiple–Wavelength Top–emitting Vertical Cavity Photonic Integrated Emitter Arrays for Direct–Coupled Wavelength Division Multiplexing Applications", *Electronics Letters*, vol. 34, No. 2, Jan. 1998.

S.Y. Hu, et al., "Optical Crosstalk in Monolithically Integrated Multiple–Wavelength Vertical Cavity Surface Laser Arrays for Multimode WDM Local–Area Networks", *Electronics Letters*, vol. 34, No. 7, Apr. 1998.

* cited by examiner

Primary Examiner—Paul Ip
Assistant Examiner—Dung T Nguyen
(74) Attorney, Agent, or Firm—Andrew A. Abeyta

(57) ABSTRACT

Vertical cavity surface emitting laser arrays that emit light at different wavelengths and that are suitable for wavelength multiplexed applications. Such arrays are beneficially produced using binary masks that control the thickness elements of a spacer, which in turn controls the wavelengths of light from the individual VCSEL elements. The binary masks can be used to control either deposition (growth) or etching. The binary masks, which are comprised of open areas and closed areas, are selectively applied to an intermediate VCSEL array structure.

29 Claims, 5 Drawing Sheets

WAVELENGTH DIVISION MULTIPLEXED VERTICAL CAVITY SURFACE EMITTING LASER ARRAY

CROSS-REFERENCE TO RELATED APPLICATIONS

Not applicable.

BACKGROUND OF THE INVENTION

1. Field of the Invention

The present invention relates generally to the field of vertical cavity surface emitting laser arrays. More specifically, it relates to vertical cavity surface emitting laser arrays that emit light at different wavelengths, and to a method of producing such arrays binary masks.

2. Discussion of the Related Art

Vertical cavity surface emitting lasers (VCSELs) represent a relatively new class of semiconductor lasers. In a VCSEL, optical emission occurs normal to the plane of a PN junction. VCSELs have certain advantages over edge-emitting laser diodes, including smaller optical beam divergence and well-defined, highly circular laser beams. Such advantages make VCSELs well suited for optical data storage, data and telecommunication systems, and laser scanning.

VCSELs can be formed from a wide range of material systems to produce specific characteristics. VCSELs typically have active regions, distributed Bragg reflector (DBR) mirrors, current confinement structures, substrates, and contacts. Because of their complicated structure and because of their material requirements, VCSELs are usually grown using metal-organic chemical vapor deposition (MOCVD) or by using molecular beam epitaxy (MBE).

To assist the understanding of VCSELs, FIG. 1 illustrates a typical VCSEL 10. As shown, an n-doped gallium arsenide (GaAS) substrate 12 is disposed with an n-type electrical contact 14. An n-doped lower mirror stack 16 (a DBR) is on the GaAS substrate 12, and an n-type graded-index lower spacer 18 is disposed over the lower mirror stack 16. An active region 20 having a plurality of quantum wells is formed over the lower spacer 18. A p-type graded-index top spacer 22 is disposed over the active region 20, and a p-type top mirror stack 24 (another DBR) is disposed over the top spacer 22. Over the top mirror stack 24 is a p-conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof). At least part of the top mirror stack 24 includes an insulating region 40 that is formed by implanting protons into the top mirror stack 24 or by forming an oxide layer. In either event, the insulating region 40 has a conductive annular central opening 42 that forms an electrically conductive path though the insulating region 40.

In operation, an external bias causes an electrical current 21 to flow from the p-type electrical contact 26 toward the n-type electrical contact 14. The insulating region 40 and its conductive central opening 42 confine the current 21 flow through the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, providing a p-type substrate), different material systems can be used, operational details can be varied, and additional structures, such as tunnel junctions, can be added. Furthermore, FIG. 1 only illustrates one VCSEL.

Producing multiple VCSELs on one substrate can be beneficial. In some applications, such as data and telecommunication systems, it is beneficial to have a VCSEL array that is comprised of multiple individual VCSEL elements that emit light at different wavelengths. Such an array could be used to implement wavelength division multiplexed systems. That is, light of one wavelength could be emitted (and, if required, modulated), then light of another wavelength could be emitted (and, if required, modulated), and so on. Because of the inherent low cost and volume capability of VCSELs, a VCSEL array suitable for wavelength division multiplexing would be highly attractive.

However, despite their many benefits, VCSEL arrays suitable for wavelength division multiplexing are not commercially available. One reason for this has been the unavailability of a low cost method of producing stable wavelength division multiplexed light beams from a single substrate.

In a VCSEL, the wavelength of the light output depends on various factors, one of which (as previously noted) is the separation of the top DBR mirror and the bottom DBR mirror. Thus, the output wavelength can be tuned by controlling the length of the cavity between the top and bottom DBRs. That cavity length is set during the manufacturing process. FIG. 2, which illustrates a side view of a simplified VCSEL element 98 of a VCSEL array, is useful for visualizing the cavity length. As shown, the VCSEL element 98 includes a substrate 100 having a backside contact 102 and a backside DBR mirror 104. An active region 106 is on the backside DBR mirror 104. A front side DBR 110 is on the active region 106. Front side electrical contacts 112 are on the front side DBR 110. Thus, the front side and back side DBR separation is controlled by the width of the active region 106 (and by the reflection depth of the DBRs). Therefore, the output wavelength is controlled by the processes that form the VCSEL element.

Therefore, a process of producing a VCSEL array that emits light beams of different wavelengths would be beneficial. Even more beneficial would be a new VCSEL array that is suitable for wavelength division multiplexing. Still more beneficial would be a low cost lithographic technique of producing VCSEL arrays that emit light beams having different wavelengths.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to a method of producing VCSEL arrays, and to VCSEL arrays produced by that method, that are capable of emitting light beams having different wavelengths and that are suitable implementing wavelength division multiplexing in a cost effective manner. According to the principles of the present invention, binary masks are used to control depositions and/or etchings of a spacer that is disposed between top DBR mirrors and an active region. By using the binary masks, the wavelengths of individual VCSEL elements on a common substrate can be controlled.

According to one method that is in accord with the principles of the present invention, a process-controlled spacer is selectively grown on an active region using a sequence of binary masks such that the spacer has multiple thicknesses that are controlled by the binary masks. Then, front side (top) DBR mirrors are disposed over the spacer. Electrical contacts for the individual VCSEL elements are then provided. Additionally, suitable isolation regions are formed, either in the spacer or in the front side DBR mirrors, such that discrete VCSEL elements are formed. Suitable spacers can be formed from regrowth $Al_xGa_{(1-x)}As$ (or similar materials), a dielectric deposition (such as PECVD $SiO_2$), or a glass deposition.

According to another method that is in accord with the principles of the present invention, a process-controlled spacer is formed over an active region. Then, that process-controlled spacer is selectively etched using a sequence of binary masks such that the spacer has multiple thicknesses in locations controlled by the binary masks. Beneficially, the spacer includes etch stop layers that accurately control the etch depth, and thus the spacer thicknesses. Then, front side DBR mirrors are disposed over the spacer and electrical contacts for the individual VCSEL elements are provided. Additionally, isolation regions are formed, either in the substrate or in the front side DBR mirrors, such that discrete VCSEL elements are produced. Suitable etch processes include isotropic planar etching, with the particular etchant that is used being dependent on the spacer material.

A VCSEL array according to the principles of the present invention includes a substrate, an active region adjacent the substrate, and a spacer having a plurality of regions with different thicknesses. Beneficially, the difference in thickness between each region is a multiple of a distance L. Front side DBR mirror structures are over the spacer, and electrical contacts for the individual VCSEL elements are over the front side DBR mirror structures.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

DETAILED DESCRIPTION OF THE ILLUSTRATED EMBODIMENTS

The principles of the present invention provide for VCSEL arrays, and for methods of fabricating such VCSEL arrays, that output light at multiple wavelengths. Such VCSEL arrays are particularly useful in wavelength division multiplexed applications.

Figure 1:
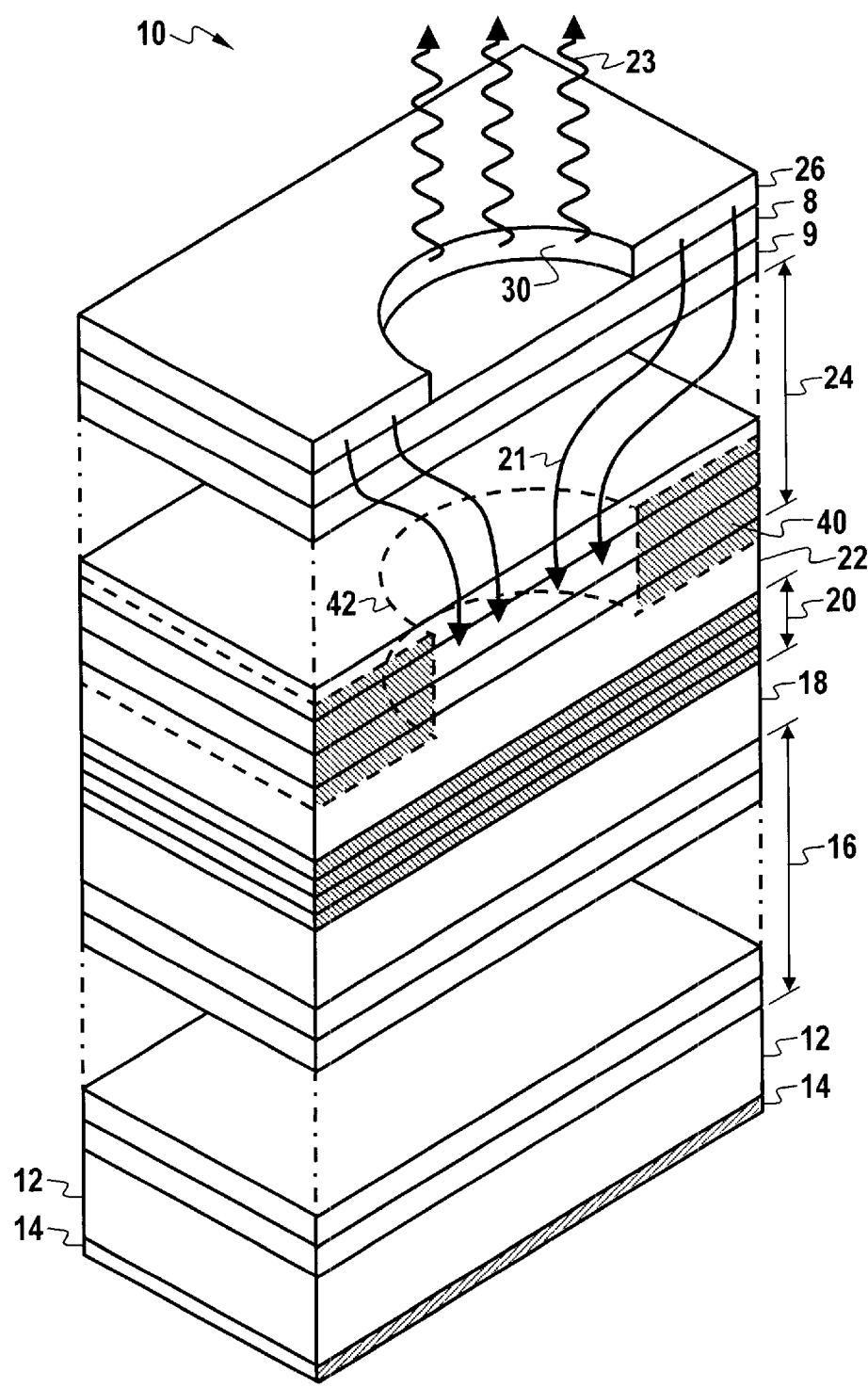
FIG. 1 illustrates a typical vertical cavity surface emitting laser.
Figure 2:
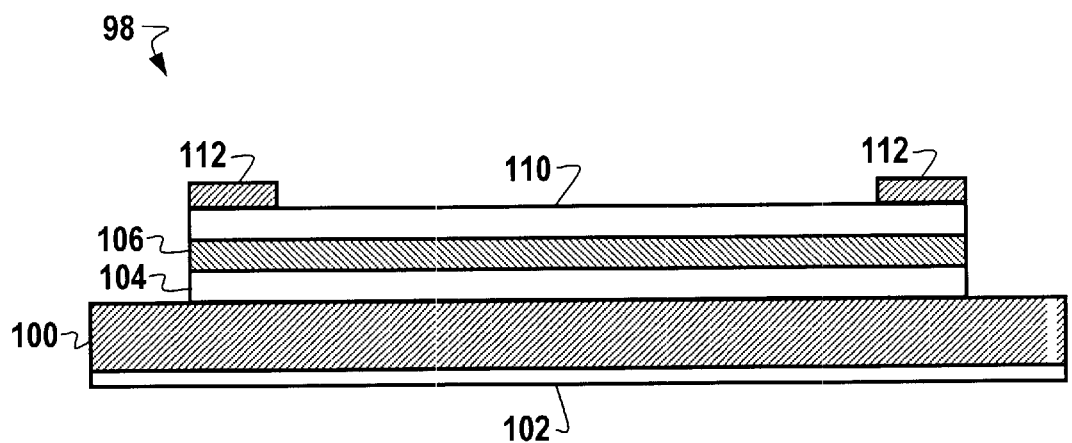
FIG. 2 illustrates a side section view of a simplified VCSEL element.
Figure 3:
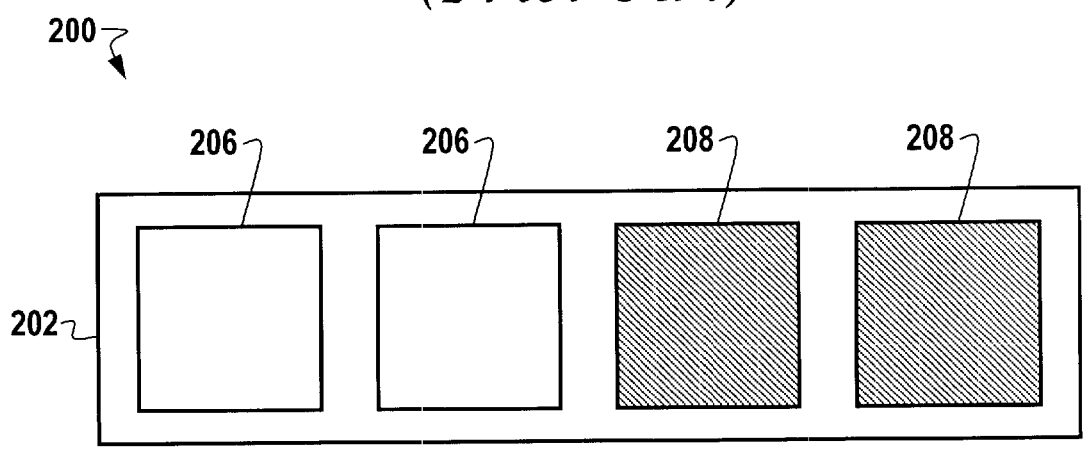
FIG. 3 illustrates a top view of a binary mask set according to the principles of the present invention.
Figure 3:
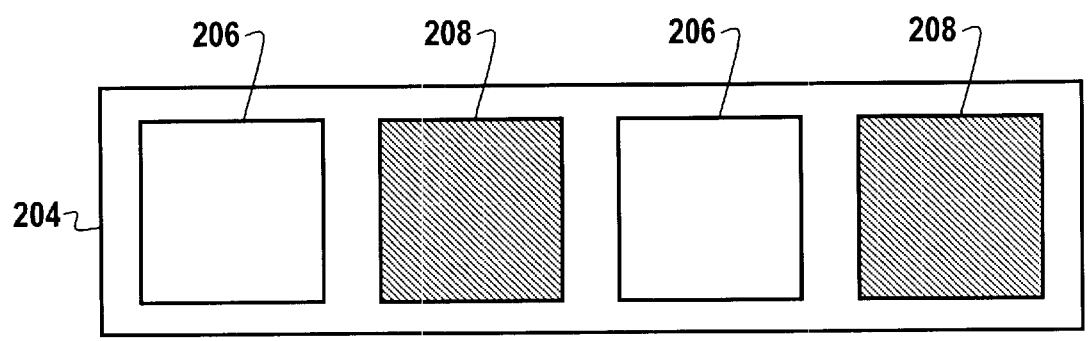

The principles of the present invention provide for forming spacers using a binary mask set. Binary masks have open and closed regions that can conceptually correspond to binary digits (0s and 1s). FIG. 3 illustrates one set 200 of binary masks, with that set being comprised of a first mask 202 and of a second mask 204. Each mask is comprised of open areas 206 (which can correspond to binary 0) and closed areas 208 (which can corresponds to binary 1).

A first use of the mask set 200 is in producing a special spacer using material depositions. Turn now to FIG. 4 for a partially fabricated VCSEL structure 300. That VCSEL structure is produced by forming an active region 302 on a lower DBR 304, which is on a substrate 306 having a metallic contact 307. Over the active region is an optional top buffer layer 308. If used, the top buffer layer 308 controls the minimum separation between the lower DBR 304 and upper DBRs that will be formed.

The first mask 202 is placed over the partially fabricated VCSEL structure 300 active region 302 (or over the top buffer layer 308). Spacer material 310 having a thickness 2L is then grown (deposited) through the open areas 206 of the first mask. Then, the first mask 202 is removed and the second mask 204 is placed over the partially fabricated VCSEL structure 300. Spacer material 312 having a thickness L is then grown through the open areas 206 of the second mask. Then, the second mask 204 is removed. Top DBRs 316 are then grown on the deposited spacer layers (isolation regions, which are not shown in FIG. 3, are fabricated as required) such that discrete VCSEL elements are produced. The result is four DBRs 316 that are spaced apart from each other, with the thickness of each spacer element being an integer multiple of L.

Figure 4:
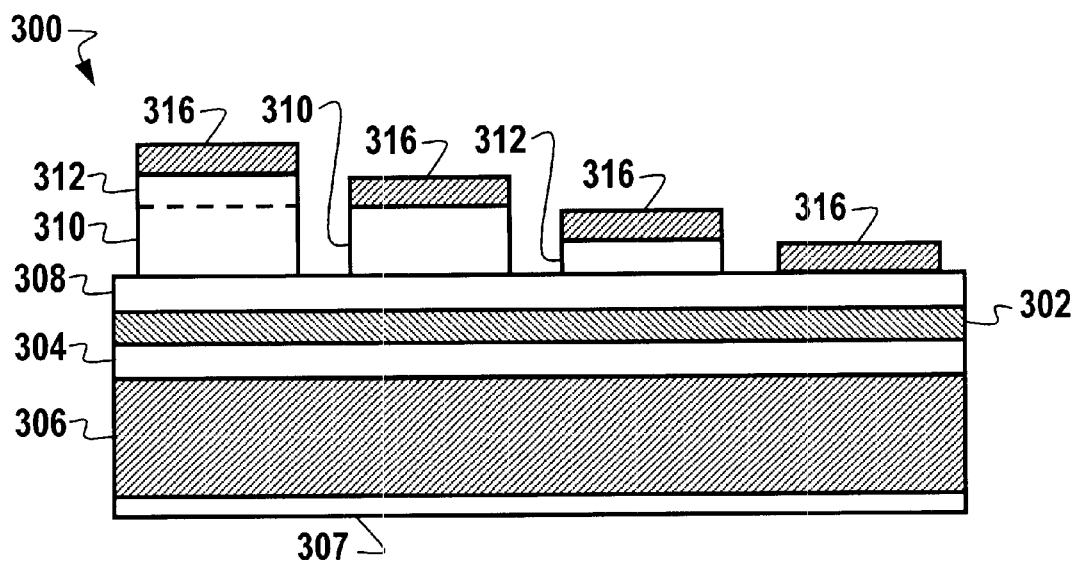
FIG. 4 illustrates a side view of a partially fabricated VCSEL array after depositions through the binary mask set illustrated in FIG. 3.

Still referring to FIG. 4, suitable spacer materials include regrowth $Al_xGa_{(1-x)}As$ (or similar materials), a dielectric deposition (such as PECVD $SiO_2$), or a glass deposition. If the deposited spacer material(s) is properly selected, the spacer can be relatively stress-free. Stress can further be reduced by annealing the structure 300 after each deposition to smooth out interface roughness. Additionally, while the foregoing is described as producing DBR separations that are multiples of L, this is not required. The thickness of the various depositions can be varied to achieve design goals.

Figure 5:
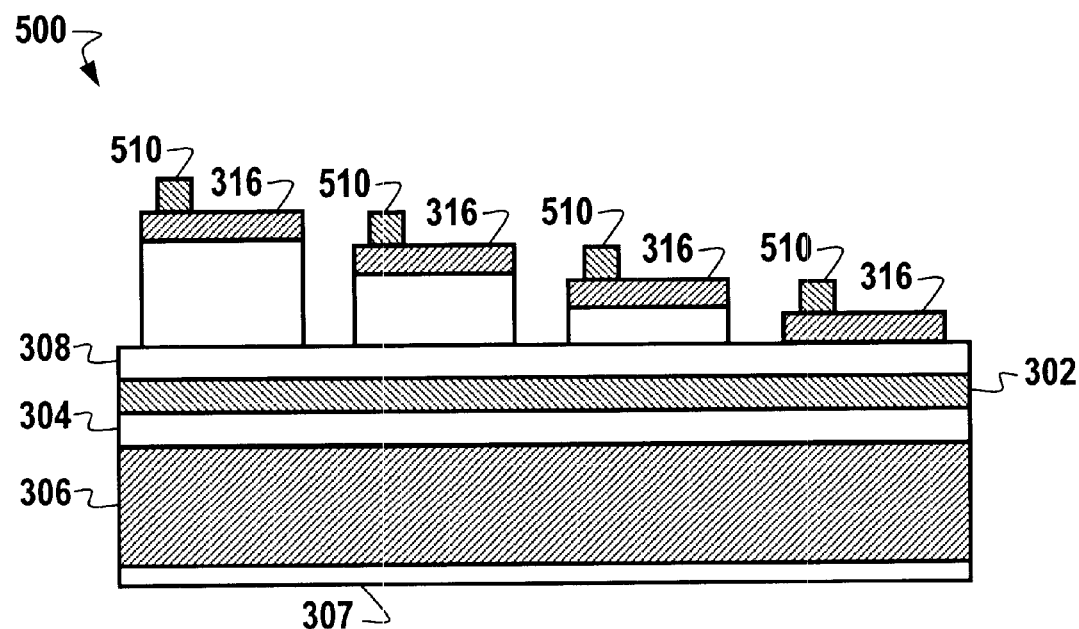
FIG. 5 illustrates a side view of a VCSEL array according to the principles of the present invention.

Referring now to FIG. 5, electrical contacts 510 are then formed on the DBRs 316. The result is a VCSEL array 500 that emits light at different wavelengths from the individual VCSEL elements.

Another use of the mask set 200 shown in FIG. 3 is in producing a special spacer by etching. Turn now to FIG. 6 for a partially fabricated VCSEL structure 400. That VCSEL structure is produced by forming an active region 302 on a lower DBR 304, which is on a substrate 306 having a contact 307. Over the active region is an optional top buffer layer 308. If used, the top buffer layer 308 controls the minimum separation between the lower DBR 304 and upper DBRs that will be formed later. Over the active region is a material 402. That material can be a dielectric deposition or a semiconductor growth. Additionally, to assist accurate etching, etch stop layers 412 can be located within the material 402.

Figure 7:
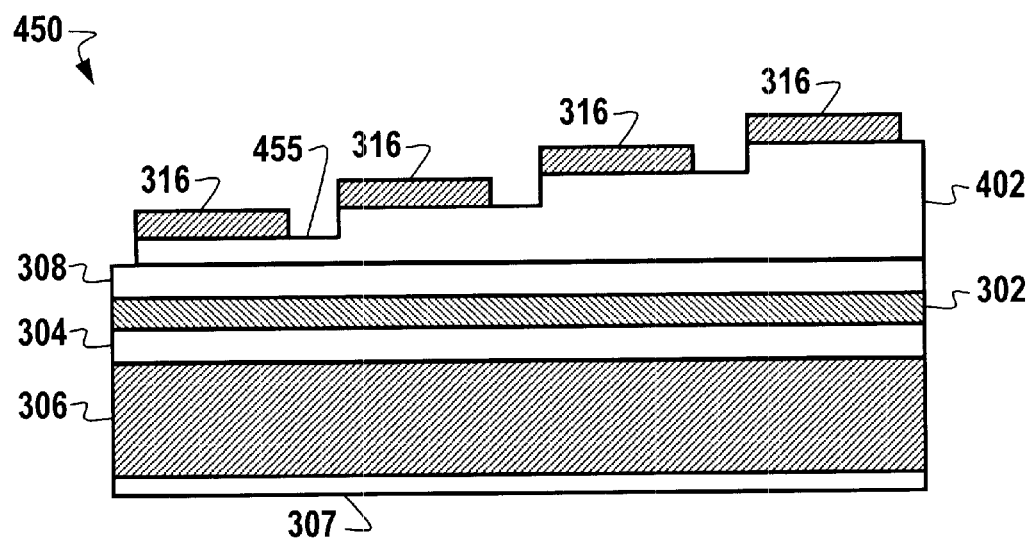
FIG. 7 illustrates a side view of a partially fabricated VCSEL array after etching the spacer of FIG. 6 through binary mask set illustrated in FIG. 3.

Referring now to FIG. 7, the first mask 202 is located over the material 402. The material 402 is then etched a distance 2L through the open areas 206 of the first mask. An etch stop layer 412 can be used to stop the etch at the proper location. Then, the first mask 202 is removed and the second mask 204 is located over the partially fabricated VCSEL structure. The material 402 is then etched a distance L through the open areas 206 of the second mask. Again, an etch stop layer can assist accurate etch depth. Then, the second mask 204 is removed. Top DBRs 316 are then grown on the etched spacer layers. The result is four DBRs 316 that are spaced apart from each other, with the separation between each of the DBRs 316 being an integer multiple of L. Electrical contacts (which are not shown, but reference the contacts 550 in FIG. 5) for the individual VCSEL elements are then provided. Isolation regions 455 are also formed in suitable locations including a location between the top DBRs 316.

Figure 6:
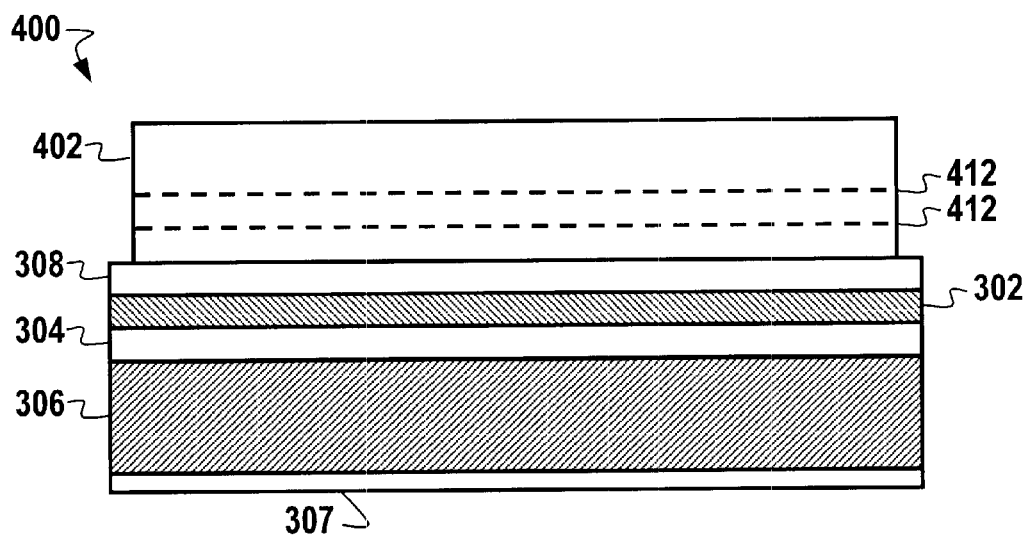
FIG. 6 illustrates a side view of a partially fabricated VCSEL array after a spacer is formed.

Referring now to FIGS. 6 and 7, the etch process is best performed using an etchant that depends on the material 402. Isotropic planar etching is beneficial. Furthermore, the material 402 can include embedded etch stop layers 412 to enable accurate control of each step's position.

Wavelength tuned VCSEL arrays produced using binary masks have the advantages of being able to produce a wide range of spacer thicknesses using lithographic techniques and relatively few masks and process steps. Furthermore, VCSEL arrays according to the present invention are relatively easily fabricated using normal fabrication processes. Also, standard processes can be used to fabricated features of the VCSEL array, such as trenches for oxidation and material growths.

Figure 8:
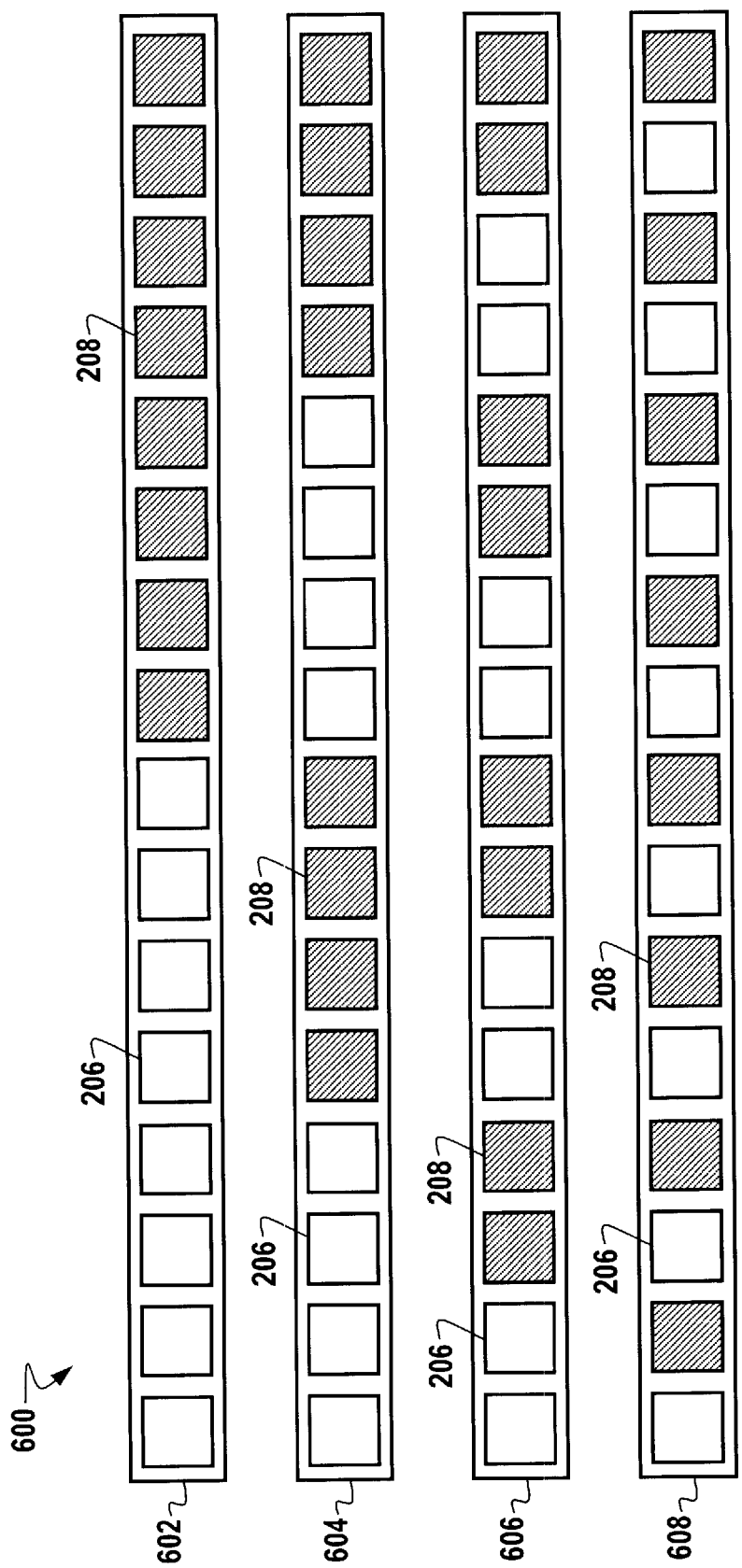
FIG. 8 illustrates a top view of another binary mask set that is in accord with the principles of the present invention Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

The foregoing has described using a binary mask set that is comprised of two individual masks (reference FIG. 3). However, the principles of the present invention encompass that use of other mask sets. For example, FIG. 8 illustrates a mask set 600 that is comprised of four individual masks, the masks 602, 604, 606, and 608. Those masks still include open areas 206 and closed areas 208. Such a mask set with 4 individual masks can produce up to 16 thickness variations. The number of thickness variations is related to a power of 2.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A method of fabricating a vertical cavity surface emitting laser array, comprising:

fabricating a structure comprised of a substrate, a first mirror on the substrate, and an active region on the first mirror;

growing at least a first spacer element and a second spacer element over the active region using a first mask, having open spaces and closed spaces, of a binary mask set;

growing at least a third spacer element over the active region and further growing the first spacer element using a second mask, having open spaces and closed spaces, of the binary mask set, and forming distributed Bragg reflector (DBR) mirrors over the first, second, and third spacer elements;

wherein the first, second, and third spacer elements have different thicknesses.

2. A method of fabricating a vertical cavity surface emitting laser array according to claim 1, wherein the first, second, and third spacer elements are formed from $Al_xGa_{(1-x)}As$.

3. A method of fabricating a vertical cavity surface emitting laser array according to claim 1, wherein the first, second, and third spacer elements are formed from a dielectric deposition.

4. A method of fabricating a vertical cavity surface emitting laser array according to claim 1, wherein the dielectric deposition is performed using $SiO_2$.

5. A method of fabricating a vertical cavity surface emitting laser array according to claim 1, wherein the first, second, and third spacer elements include glass.

6. A method of fabricating a vertical cavity surface emitting laser array according to claim 1, wherein the first spacer element and the second spacer element are formed with a thickness difference of L, and wherein the first spacer element and the third spacer element are formed with a thickness difference of 2L.

7. A method of fabricating a vertical cavity surface emitting laser array according to claim 1, further including forming electrical contacts on the top DBR mirrors.

8. A method of fabricating a vertical cavity surface emitting laser array according to claim 7, further including forming isolation regions to form discrete VCSEL elements.

9. A method of fabricating a vertical cavity surface emitting laser array, comprising:

fabricating a structure having a substrate, a first mirror on the substrate, an active region on the first mirror, and a spacer on the active region;

etching the spacer through a first mask, having open spaces and closed spaces, of a binary mask set to define at least a first spacer element and a second spacer element;

etching the spacer through a second mask, having open spaces and closed spaces, of the binary mask set to define at least a third spacer element and to further define the first spacer element, and forming distributed Bragg reflector (DBR) mirrors over at least the first, second, and third spacer elements;

wherein the DBR mirrors are separated by the first, second, and third spacer elements at different distances from a top of the active region.

10. A method of fabricating a vertical cavity surface emitting laser array according to claim 9, wherein the spacer includes etch stop layers.

11. A method of fabricating a vertical cavity surface emitting laser array according to claim 9, further including forming electrical contacts on the DBR mirrors.

12. A method of fabricating a vertical cavity surface emitting laser array according to claim 11, further including forming isolation regions to form discrete VCSEL elements.

13. A method of fabricating a vertical cavity surface emitting laser array according to claim 9, wherein said etching includes isotropic planar etching.

14. A method of fabricating a vertical cavity surface emitting laser array according to claim 9, wherein the first spacer element and the second spacer element are formed with a thickness difference of L, and wherein the first spacer element and the third spacer element are formed with a thickness difference of 2L.

15. A VCSEL array, comprising:

a substrate having a first electrical contact;

an active region over the substrate;

a plurality of spacer elements over the active region, each spacer element having a different thickness;

a plurality of front side DBR mirrors, each located on an associated spacer element such that the distance from each front side DBR mirror to the active region depends on the thicknesses of the spacer elements; and a plurality of electrical contacts, each located on an associated front side DBR mirror, wherein the plurality of spacer elements, each having a different thickness, are formed by successively applying a binary mask set.

16. A VCSEL array according to claim 15, wherein said VCSEL array emits a plurality of wavelengths of light, wherein each of the wavelengths is dependent on a distance from an associated front side DBR mirror to the active region.

17. A VCSEL array according to claim 16, wherein a distance from each front side DBR mirror to a top surface of said active region is an integer multiple of L.

18. A VCSEL array according to claim 15, further including isolation regions between the front side DBR mirrors.

19. A VCSEL array according to claim 15, further including a buffer layer between said spacer and said active region.

20. A method of fabricating an array having a plurality of VCSELs, comprising:

fabricating a structure comprised of a substrate, a lower DBR mirror over the substrate, and an active region over the lower DBR mirror;

forming a plurality of spacer elements over the active region by successively growing a spacer material using a set of binary masks; and forming top DBR mirrors over the spacer elements;

wherein at least two of the spacer elements have different thicknesses and at least two of the VCSELs generate LASER lights with different wavelengths.

21. A method of fabricating an array having a plurality of VCSELs according to claim 20, wherein the spacer material includes $Al_xGa_{(1-x)}As$.

22. A method of fabricating an array having a plurality of VCSELs according to claim 20, wherein the spacer material includes $SiO_2$ or glass.

23. A method of fabricating an array having a plurality of VCSELs according to claim 20, wherein the thicknesses of the spacer elements differ by L, where L is a thickness formed by one of the masks in the set of binary masks.

24. A method of fabricating an array having a plurality of VCSELs according to claim 20, further including forming electrical contacts on the top DBR mirrors.

25. A method of fabricating an array having a plurality of VCSELs, comprising:

fabricating a structure comprised of a substrate, a lower DBR mirror over the substrate, and an active region over the lower DBR mirror;

growing a spacer material over the active region;

forming a plurality of spacer elements by successively etching the spacer material using a set of binary masks; and forming top DBR mirrors over the spacer elements;

wherein at least two of the spacer elements have different thicknesses and at least two of the VCSELs generate LASER lights with different wavelengths.

26. A method of fabricating an array having a plurality of VCSELs according to claim 25, wherein the spacer material includes $Al_xGa_{(1-x)}As$.

27. A method of fabricating an array having a plurality of VCSELs according to claim 25, wherein the spacer material includes $SiO_2$ or glass.

28. A method of fabricating an array having a plurality of VCSELs according to claim 25, wherein the thicknesses of the spacer elements differ by L, where L is a thickness etched by one of the masks in the set of binary masks.

29. A method of fabricating an array having a plurality of VCSELs according to claim 25, further including forming electrical contacts on the top DBR mirrors.

* * * * *